(12) United States Patent
Shinh et al.

(10) Patent No.: US 9,831,225 B2
(45) Date of Patent: Nov. 28, 2017

(54) LOW-IMPEDANCE POWER DELIVERY FOR A PACKAGED DIE

(71) Applicant: NVIDIA CORPORATION, Santa Clara, CA (US)

(72) Inventors: Gurpreet Shinh, Cupertino, CA (US); Donald E. Templeton, San Jose, CA (US); Brian S. Schieck, Hayward, CA (US); Alex Waizman, Sunnyvale, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 14/943,937

(22) Filed: Nov. 17, 2015

(65) Prior Publication Data

US 2016/0148915 A1    May 26, 2016

Related U.S. Application Data

(62) Division of application No. 13/443,762, filed on Apr. 10, 2012, now Pat. No. 9,190,396.

(51) Int. Cl.
*H01L 25/16* (2006.01)
*H01L 23/498* (2006.01)
*H01L 23/50* (2006.01)
*H01L 23/64* (2006.01)
*H01L 25/18* (2006.01)

(52) U.S. Cl.
CPC ........ *H01L 25/16* (2013.01); *H01L 23/49816* (2013.01); *H01L 23/49822* (2013.01); *H01L 23/49827* (2013.01); *H01L 23/49838* (2013.01); *H01L 23/50* (2013.01); *H01L 23/645* (2013.01); *H01L 25/18* (2013.01); *H01L 2224/16225* (2013.01); *H01L 2924/15192* (2013.01); *H01L 2924/15311* (2013.01); *H01L 2924/19041* (2013.01); *H01L 2924/19105* (2013.01)

(58) Field of Classification Search
CPC ... H01L 25/16; H01L 25/18; H01L 23/49816; H01L 23/49822; H01L 23/49827; H01L 23/49838; H01L 23/50; H01L 23/465
See application file for complete search history.

(56) References Cited

U.S. PATENT DOCUMENTS

| | | | |
|---|---|---|---|
| 5,574,630 A | 11/1996 | Kresge et al. | |
| 2007/0289771 A1* | 12/2007 | Osaka | H01L 23/66 174/250 |
| 2008/0284037 A1* | 11/2008 | Andry | H01L 21/6835 257/774 |

* cited by examiner

*Primary Examiner* — Whitney T Moore
(74) *Attorney, Agent, or Firm* — Artegis Law Group, LLP

(57) ABSTRACT

A system includes a semiconductor die mounted on a packaging substrate, a signal redistribution layer that is formed within the packaging substrate, a power plane that is formed on a surface of the packaging substrate, and a ground plane that is formed within the packaging substrate. The power plane couples the semiconductor die to a capacitor disposed on the packaging substrate and the ground plane is disposed between the power plane and the signal redistribution layer. An advantage of the disclosed system is that loop inductance between power and ground paths to a packaged semiconductor die is reduced, thereby lowering the impedance of the packaged semiconductor die system and signal noise associated with the packaged semiconductor system.

18 Claims, 3 Drawing Sheets

LOW-IMPEDANCE POWER DELIVERY FOR A PACKAGED DIE

CROSS-REFERENCE TO RELATED APPLICATIONS

This application is a divisional of the co-pending U.S. patent application titled, "LOW-IMPEDANCE POWER DELIVERY FOR A PACKAGED DIE," filed on Apr. 10, 2012 and having Ser. No. 13/443,762. The subject matter of this related application is hereby incorporated herein by reference.

BACKGROUND OF THE INVENTION

Field of the Invention

Embodiments of the present invention relate generally to semiconductor chip packaging and, more specifically, to a system for low-impedance power delivery for a packaged die.

Description of the Related Art

Advances in the design and fabrication of semiconductor devices has dramatically increased device speed but has, at the same time, led to significant challenges in the field of semiconductor packaging. These challenges are particularly acute with respect to minimizing the parasitic resistance, inductance, and capacitance effects introduced by the various interconnect elements of a semiconductor package, such as the power and ground planes, signal traces, packaging substrate vias, and microbumps that are electrically coupled to a packaged semiconductor die. More particularly, in the power delivery network of a packaged semiconductor die, parasitic effects caused by loop inductance between power and ground paths to the semiconductor die can be performance-limiting factors. Such inductance degrades signal quality and reduces the input/output bandwidth of the die.

Accordingly, there is a need in the art for a system that provides reduced impedance power delivery for a packaged die.

SUMMARY OF THE INVENTION

One embodiment of the present invention sets forth a system that includes a semiconductor die mounted on a packaging substrate, a signal redistribution layer that is formed within the packaging substrate, a power plane that is formed on a surface of the packaging substrate, and a ground plane that is formed within the packaging substrate. The power plane couples the semiconductor die to a capacitor disposed on the packaging substrate and the ground plane is disposed between the power plane and the signal redistribution layer.

One advantage of the disclosed system is that loop inductance between power and ground paths to a packaged semiconductor die is reduced, thereby lowering the impedance of the packaged semiconductor die system and signal noise associated with the packaged semiconductor system. With lower signal noise, input/output bandwidth to the semiconductor die can be advantageously increased.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION

Embodiments of the present invention set forth a packaged semiconductor die system configured with interconnect elements that have low loop inductance. Power and ground paths that couple a semiconductor die to an external mounting structure, such as a printed circuit board, are routed through the packaged semiconductor die system in a way that minimizes the length of the power and ground paths and disposes the power and ground paths as close as practicable to each other. Specifically, a ground plane and a power plane coupling the die to a decoupling capacitor are not separated by a signal redistribution layer and instead are disposed on adjacent layers of a packaging substrate. In addition, a decoupling capacitor is positioned so that ground and power connections that connect the capacitor to a packaging substrate are respectively aligned with ground and power connections of the packaging substrate that connect the packaging substrate to an external mounting structure.

Figure 1:
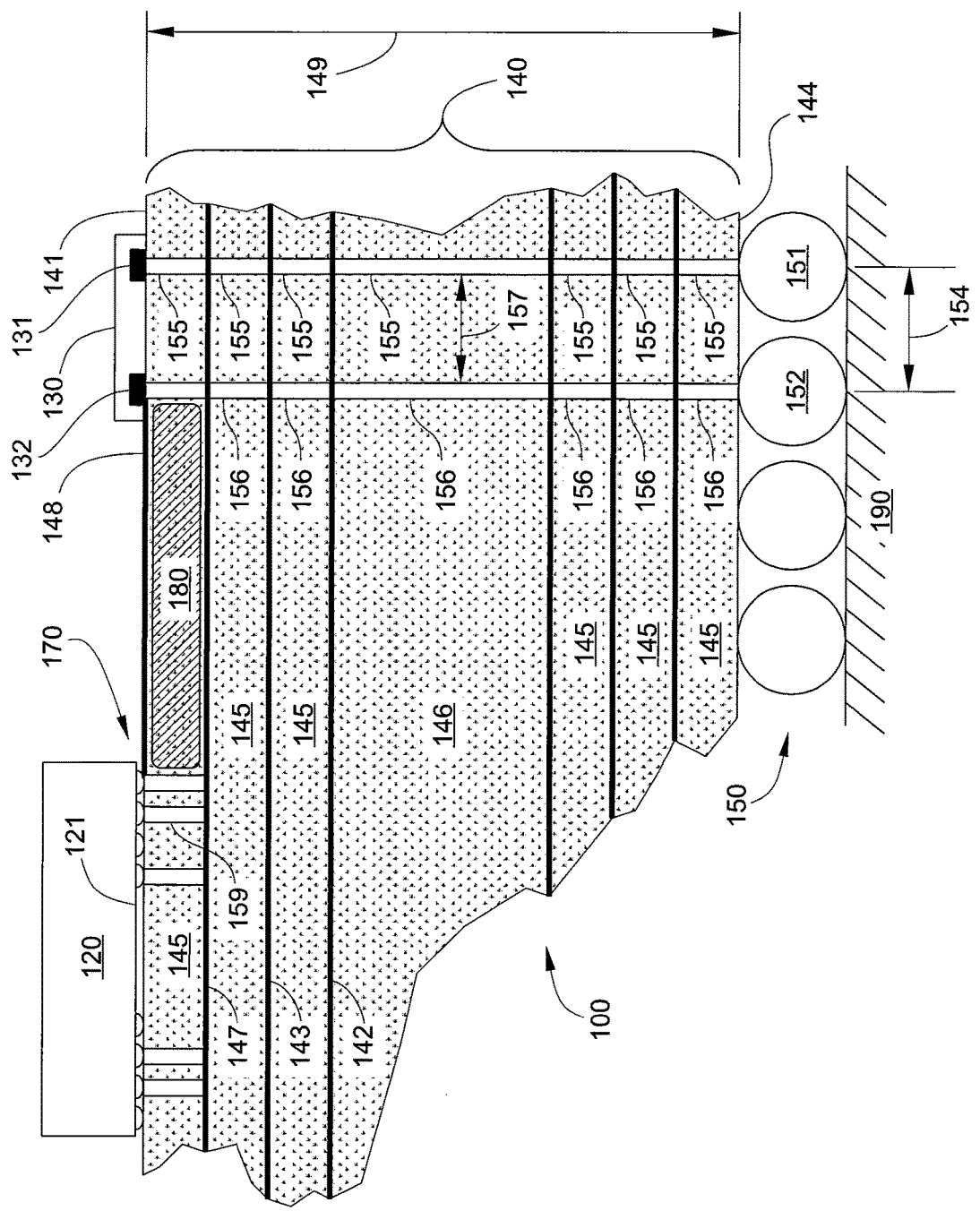
FIG. 1 is a schematic cross-sectional view of a packaged semiconductor die system, according to one embodiment of the present invention.

FIG. 1 is a schematic cross-sectional view of a packaged semiconductor die system 100, according to one embodiment of the present invention. Packaged semiconductor die system 100 includes a semiconductor die 120 and a decoupling capacitor 130 mounted on a packaging substrate 140. In addition, packaged semiconductor die system 100 is configured with diainterconnect elements that have low loop inductance during operation semiconductor die 120. These interconnect elements (described below) couple semiconductor die 120 to an external mounting structure 190.

External mounting structure 190 may comprise any technically feasible support structure, such as a printed circuit board (PCB), for mechanically and electrically coupling packaged semiconductor die system 100 to a computing system or other electronic device. As shown in FIG. 1, packaged semiconductor die system 100 is electrically coupled to external mounting structure 190 with a plurality of electrical connections 150, including electrical connections 151 and 152. Electrical connections 150 may include any technically feasible chip package electrical connections known in the art, including a ball-grid array (BGA), a pin-grid array (PGA), and the like.

Packaging substrate 140 provides packaged semiconductor die system 100 with structural rigidity as well as an electrical interface for routing ground, input/output (I/O) signals, and power between semiconductor die 120 and external mounting structure 190. In some embodiments, packaging substrate 140 comprises a laminate substrate and is composed of a stack of dielectric layers 145 or laminates that are built up on top and bottom surfaces of one or more thicker core layers 146. In the embodiment illustrated in FIG. 1, packaging substrate 140 comprises a single core layer 146 with three dielectric layers 145 formed on two surfaces thereof. The core layer 146 is generally a thicker layer, for example on the order of several hundred microns in thickness. The dielectric layers 145 are generally much thinner layers, for example on the order of about 10 to 50 microns. As shown, conductive interconnect layers are formed between dielectric layers 145 and include a ground plane 142, a signal redistribution layer 143, a ground plane 147, and a power plane 148. Conductive paths are formed between these interconnect layers with via structures that route ground, I/O signals, and power between semiconductor die 120 and external mounting structure 190. For clarity, only selected via structures are depicted in FIG. 1, including via structures 155, 156, and 159. In practice, many more via structures may be formed in the various dielectric layers 145 and core layer 146 to provide the desired electrical connectivity between semiconductor die 120 and external mounting structure 190. It is noted that for clarity, the thickness of packaging substrate 140, dielectric layers 145, and core layer 146 is exaggerated with respect to the width of via structures 155 and 156, which may be on the order of 100 microns or more.

Via structures 155 and 156 may be plated through-hole vias, which are well-known in the art, or any other technically feasible via structure. The dimensions and materials of via structures 155 and 156 may be selected based on the configuration of semiconductor die 120, dielectric layers 145, and electrical connections 150. As shown in FIG. 1, via structures 155 provide routing of ground from electrical connection 151 to decoupling capacitor 130 and via structures 156 provide routing of power from electrical connection 152 to decoupling capacitor 130. Ground plane 147 provides routing of ground to selected electrical connections 170 between semiconductor die 120 and packaging substrate 140. Similarly, power plane 148 provides routing of power from decoupling capacitor 130 to selected electrical connections 170.

Semiconductor die 120 comprises an integrated circuit (IC) chip, such as a central processing unit (CPU), a graphics processing unit (GPU), an application processor or other logic device, or any other IC chip that may benefit from embodiments of the present invention. Semiconductor die 120 generally comprises an unencapsulated die that is not contained in a chip carrier or package, but in some embodiments semiconductor die 120 may comprise an encapsulated chip. As shown, semiconductor die 120 is mounted on a surface 141 of packaging substrate 140 and is electrically coupled to electrical connections 142 on surface 141 of packaging substrate 140. Electrical connections 170 between semiconductor die 120 and packaging substrate 140 may be made using any technically feasible approach known in the art, including soldering of controlled collapse chip connection (C4) microbumps disposed on surface 121 of semiconductor die 120 to bond pads (not shown for clarity) formed on surface 141 of packaging substrate 140. Alternatively, such electrical connections may be made by mechanically pressing a pin-grid array on semiconductor die 120 into through-holes or sockets formed in packaging substrate 140.

Decoupling capacitor 130 is mounted on packaging substrate 140 and is configured to reduce the effect of signal noise caused by other elements of packaged semiconductor die system 100 and to provide homogeneous power delivery to semiconductor die 120. Consequently, decoupling capacitor 130 is electrically coupled to ground plane 147 and power plane 148, which are each formed on different dielectric layers 145 of packaging substrate 140. As shown, decoupling capacitor 130 is positioned on surface 141 of packaging substrate 140 so that a ground connection 131 is substantially aligned with electrical connection 151 on surface 144 of packaging substrate 140 and a power connection 132 is substantially aligned with an electrical connection 152 on surface 144 of packaging substrate 140. Electrical connection 151 corresponds to a ground connection from external mounting structure 190 to packaging substrate 140, and electrical connection 152 corresponds to a power connection from external mounting structure 190 to packaging substrate 140.

Because ground connection 131 is substantially aligned with electrical connection 151, the electrical path length for ground from external mounting structure 190 to decoupling capacitor 130 can be minimized, i.e., the electrical path is not significantly longer than a thickness 149 of packaging substrate 140. Specifically, if electrical connection 151 is positioned at any other location on surface 144, the electrical path length for connecting ground from external mounting structure 190 to decoupling capacitor 130 is significantly greater than thickness 149. Similarly, because power connection 132 is substantially aligned with electrical connection 152, the electrical path length for connecting power from external mounting structure 190 to decoupling capacitor 130 can be minimized to be approximately equal to thickness 149.

One of skill in the art will appreciate that because the ground and power paths from external mounting structure 190 to decoupling capacitor 130 each have minimum length, loop inductance of packaged semiconductor die system 100 is reduced. Furthermore, ground connection 131 and power connection 132 are disposed adjacent each other and electrical connections 151 and 152 are disposed adjacent each other. Consequently, the electrical path for ground formed in packaging substrate 140 by via structures 155 can be disposed adjacent to the electrical path for power formed in packaging substrate 140 by via structures 156, thereby minimizing a distance 157 between via structures 155 and via structures 156. Because via structures 155 and via structures 156 are positioned in close proximity, loop inductance therebetween is minimized. In some embodiments, distance 157 can be as little as twice the diameter of the smallest via structure in via structures 155 or 156.

The short path length for and close proximity between ground and power connections from decoupling capacitor 130 and external mounting structure 190 is manifested in various embodiments of decoupling capacitor 130 and external mounting structure 190. For example, in some embodiments, decoupling capacitor 130 is configured so that ground connection 131 and power connection 132 can be substantially aligned with electrical connections 151 and 152, respectively. In other embodiments, a pitch 154 of electrical connections 151 and 152 is selected so that electrical connections 151 and 152 have approximately the same separation therebetween as ground connection 131 and power connection 132.

In some embodiments, a desired short electrical path length and tight coupling of ground and power connections between decoupling capacitor 130 and external mounting structure 190 is manifested in various configurations of via structures 155 and 156. In some embodiments, via structures 155 are positioned in dielectric layers 145 to form a substantially straight electrical path in packaging substrate 140 between ground connection 131 and electrical connection 151, and via structures 156 are positioned in dielectric layers 145 to form a substantially straight electrical path between power connection 132 and electrical connection 152. It is noted that due to inaccuracies in hole drilling, layer-to-layer registration in packaging substrate 140, plating thickness, and the like, via structures 155 and 156 may not be formed into perfectly linear structures. Consequently, any substantially linear configuration of via structures 155 and/or 156 in packaging substrate 140 falls within the scope of the present invention. For example, two adjacent via structures 155 may be out of alignment with each other by as much as about twice the diameter of either via structure and still provide a substantially shortened electrical path between ground connection 131 and electrical connection 151.

Figure 2:
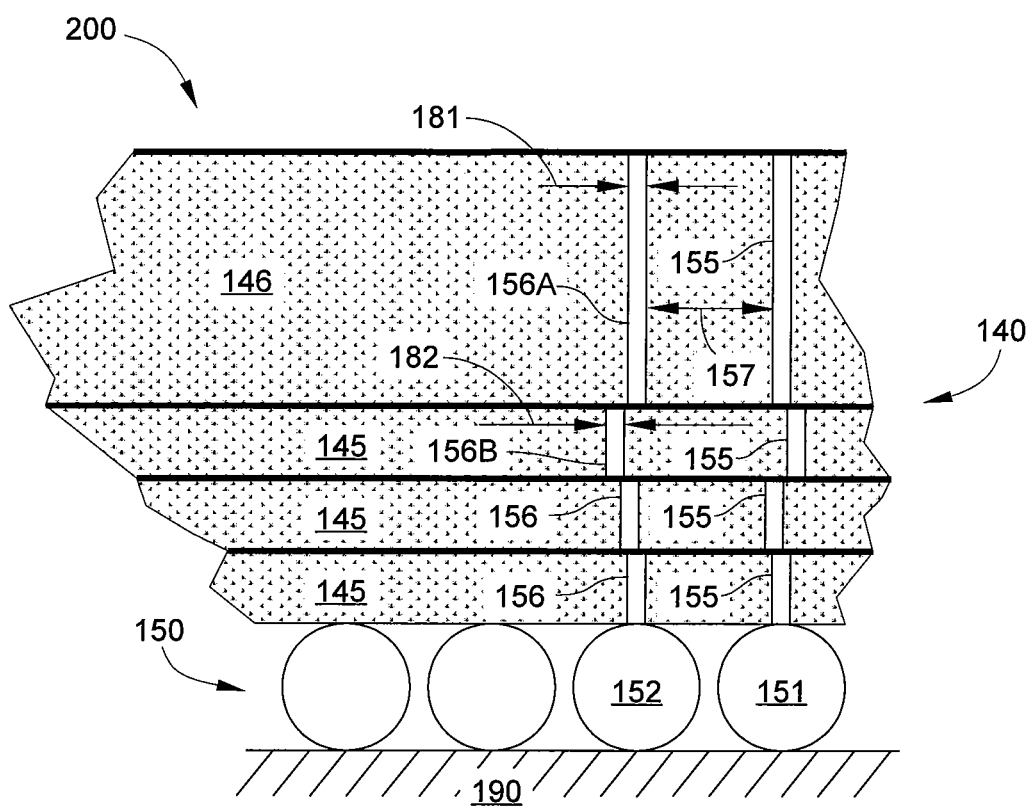
FIG. 2 is a partial schematic cross-sectional view of a packaged semiconductor die system, according to one embodiment of the present invention.

One such embodiment is illustrated in FIG. 2, which is a partial schematic cross-sectional view of a packaged semiconductor die system 200, according to one embodiment of the present invention. As shown, any two adjacent via structures in packaging substrate 140 that form part of an electrical connection from external mounting structure 190, for example via structures 156A and 1568, may be out of alignment with each other and still form a substantially shortened electrical path between external mounting structure 190 and decoupling capacitor 130. In some embodiments, via structures 156A and 1568 may be out of alignment with each other by as much as approximately twice a diameter 181 of via structure 156A or twice a diameter 182 of via structure 156B and still fall within the scope of the present invention, since a substantially shortened electrical path is formed between external mounting structure 190 and decoupling capacitor 130.

Furthermore, in some embodiments, the electrical path formed by via structures 155 and the electrical path formed by via structures 156 may be substantially parallel, so that in each dielectric layer 145 a via structure 155 is separated from a corresponding via structure 156 by a distance 157, as shown in FIG. 1. In some embodiments, distance 157 may vary slightly for each dielectric layer, as depicted in FIG. 2, while in other embodiments, distance 157 is substantially equal in each of dielectric layers 145.

In some embodiments, low impedance coupling of decoupling capacitor 130 to semiconductor die 120 is accomplished by the configuration of ground plane 147 and power plane 148 illustrated in FIG. 1. Specifically, ground plane 147 and power plane 148 are formed on adjacent layers of packaging substrate 140, and are not separated by signal redistribution layer 143. In some such embodiments, the dielectric layer 145 separating ground plane 147 and power plane 148 may be less than 30 microns thick. In other embodiments, such a dielectric layer may be on the order of 10 to 50 microns thick. Consequently, the loop area 180 (crosshatched) between ground plane 147 and power plane 148 is much smaller than a loop area that would be formed between power plane 148 and ground plane 142 if ground plane 147 were not present. Consequently, the configuration of ground plane 147 and power plane 148 illustrated in FIG. 1 reduces the impedance of packaged semiconductor die system 100.

Figure 3:
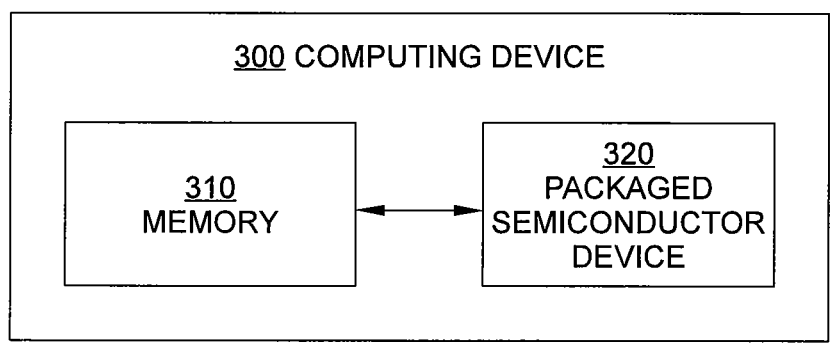
FIG. 3 illustrates a computing device in which one or more embodiments of the present invention can be implemented.

FIG. 3 illustrates a computing device in which one or more embodiments of the present invention can be implemented. Specifically, FIG. 3 is a block diagram of a computer system 300 with a packaged semiconductor device 320 configured according to an embodiment of the present invention. As shown, computer system 300 includes a memory 310 and a packaged semiconductor device 320 that is coupled to memory 310. Computer system 300 may be a desktop computer, a laptop computer, a smartphone, a digital tablet, a personal digital assistant, or other technically feasible computing device. Memory 310 may include volatile, non-volatile, and/or removable memory elements, such as random access memory (RAM), read-only memory (ROM), a magnetic or optical hard disk drive, a flash memory drive, and the like. Packaged semiconductor device 320 is substantially similar in organization and operation to packaged semiconductor die system 100 described above in conjunction with FIG. 1, and may comprise a CPU, a GPU, an application processor or other logic device, or any other IC chip-containing device.

In sum, embodiments of the present invention set forth a packaged semiconductor die system configured with interconnect elements that have low loop inductance during operation of the die. Power and ground paths that couple a die to an external mounting structure, such as a printed circuit board, are routed through the packaged semiconductor die system in a way that minimizes the length of the power and ground paths and maximizes the proximity of the power and ground paths to each other. Advantageously, loop inductance between power and ground paths to a packaged semiconductor die is reduced, thereby lowering the impedance of the packaged semiconductor die system and signal noise associated with the packaged semiconductor system. With lower signal noise, input/output bandwidth to the semiconductor die can be advantageously increased.

While the foregoing is directed to embodiments of the present invention, other and further embodiments of the invention may be devised without departing from the basic scope thereof, and the scope thereof is determined by the claims that follow.

We claim:

1. A system, comprising:
   a first electrical connection and a second electrical connection disposed on a first side of a packaging substrate;
   a capacitor disposed on a second side of the packaging substrate and positioned substantially opposite the first electrical connection and the second electrical connection;
   a first via path through the packaging substrate that couples the first electrical connection to a ground connection on the capacitor; and
   a second via path through the packaging substrate that couples the second electrical connection to a power connection on the capacitor,
   wherein the first via path and the second via path are substantially parallel to one another,
   wherein at least one of the first via path and the second via path comprises a non-aligned via path, and a first via included in the non-aligned via path is out of alignment with an adjacent second via included in the non-aligned via path by less than twice the diameter of either of the first via or the second via, and
   wherein the capacitor is electrically coupled to a semiconductor die disposed on the packaging substrate.

2. The system of claim 1, wherein one of the first via path and the second via path has a length that is substantially equal to a thickness of the packaging substrate.

3. The system of claim 1, wherein the first via path and the second via path are separated by a distance that is less than or equal to twice the diameter of a via in one of the via paths.

4. The system of claim 1, wherein the first electrical connection and the second electrical connection each comprise a solder ball coupled to a printed circuit board.

5. The system of claim 1, wherein the capacitor is electrically coupled to the semiconductor die via a ground plane that is coupled to the first via path and a power plane that is coupled to the second via path.

6. The system of claim 5, wherein the packaging substrate further comprises a signal redistribution layer and the ground plane is disposed between the power plane and the signal redistribution layer.

7. The system of claim 1, wherein the non-aligned via path further comprises a third via that is out of alignment with the adjacent second via by less than twice the diameter of either of the second via or the third via.

8. The system of claim 1, wherein the capacitor is positioned on the second side of the packaging substrate so that the ground connection on the capacitor is disposed substantially opposite the first electrical connection and the power connection on the capacitor is disposed substantially opposite the second electrical connection.

9. The system of claim 1, further comprising:
a signal redistribution layer that is formed within the packaging substrate;
a power plane that is formed on a surface of the packaging substrate and couples the semiconductor die to the capacitor; and
a ground plane that is formed within the packaging substrate and disposed between the power plane and the signal redistribution layer.

10. The system of claim 9, further comprising a dielectric layer that is disposed between the power plane and the ground plane and has a thickness that is less than about 50 microns, wherein the only layer of the packaging substrate that is disposed between the power plane and the ground plane is the dielectric layer.

11. A computing device, comprising:
a memory; and
a packaged semiconductor device coupled to the memory, wherein the semiconductor device comprises:
a first electrical connection and a second electrical connection disposed on a first side of a packaging substrate;
a capacitor disposed on a second side of the packaging substrate and positioned substantially opposite the first electrical connection and the second electrical connection;
a first via path through the packaging substrate that couples the first electrical connection to a ground connection on the capacitor; and
a second via path through the packaging substrate that couples the second electrical connection to a power connection on the capacitor,
wherein the first via path and the second via path are substantially parallel to one another, at least one of the first via path and the second via path comprises a non-aligned via path, and a first via included in the non-aligned via path is out of alignment with an adjacent second via included in the non-aligned via path by less than twice the diameter of either of the first via or the second via, and the capacitor is electrically coupled to a semiconductor die disposed on the packaging substrate.

12. The computing device of claim 11, wherein one of the first via path and the second via path has a length that is substantially equal to a thickness of the packaging substrate.

13. The computing device of claim 11, wherein the first via path and the second via path are separated by a distance that is less than or equal to twice the diameter of a via in one of the via paths.

14. The computing device of claim 11, wherein each of the first electrical connection and the second electrical connection comprises a solder ball coupled to a printed circuit board.

15. The computing device of claim 11, wherein the capacitor is electrically coupled to the semiconductor die via a ground plane that is coupled to the first via path and a power plane that is coupled to the second via path.

16. The computing device of claim 11, wherein the packaging substrate further comprises a signal redistribution layer and the ground plane is disposed between the power plane and the signal redistribution layer.

17. The computing device of claim 11, wherein the non-aligned via path further comprises a third via that is out of alignment with the adjacent second via by less than twice the diameter of either of the second via or the third via.

18. The computing device of claim 11, wherein the capacitor is positioned on the second side of the packaging substrate such that the ground connection on the capacitor is disposed substantially opposite to the first electrical connection and the power connection on the capacitor is disposed substantially opposite to the second electrical connection.

* * * * *